United States Patent
Lu et al.

(10) Patent No.: US 8,921,150 B2
(45) Date of Patent: Dec. 30, 2014

(54) PROCESS TO ACHIEVE CONTACT PROTRUSION FOR SINGLE DAMASCENE VIA

(71) Applicant: Taiwan Semiconductor Manufacturing Co. Ltd., Hsin-Chu (TW)

(72) Inventors: Hsin-Hsien Lu, Hsinchu (TW); Chia-Fang Tsai, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

(21) Appl. No.: 13/706,615

(22) Filed: Dec. 6, 2012

(65) Prior Publication Data
US 2014/0159244 A1 Jun. 12, 2014

(51) Int. Cl.
*H01L 21/00* (2006.01)
*H01L 21/768* (2006.01)
*H01L 23/48* (2006.01)

(52) U.S. Cl.
CPC ........ *H01L 23/481* (2013.01); *H01L 21/76843* (2013.01)

USPC .................................. 438/98; 257/E29.064

(58) Field of Classification Search
USPC ............ 438/98, 233, 523, 533; 257/E29.064
See application file for complete search history.

(56) References Cited

U.S. PATENT DOCUMENTS

2003/0022110 A1* 1/2003 Huang .......................... 430/311

* cited by examiner

*Primary Examiner* — Selim Ahmed
(74) *Attorney, Agent, or Firm* — Eschweiler & Associates, LLC (57) ABSTRACT

The present disclosure relates to a method of forming a back-end-of-the-line metal contact that eliminates RC opens caused by metal dishing during chemical mechanical polishing. The method is performed by depositing a sacrificial UV/thermal decomposition layer (UTDL) above an inter-level dielectric (ILD) layer. A metal contact is formed that extend through the ILD layer and the sacrificial UTDL. A chemical mechanical polishing (CMP) process is performed to generate a planar surface comprising the sacrificial UTDL. The sacrificial UTDL is then removed through an ultraviolet exposure or a thermal anneal, so that the metal contact protrudes from the ILD layer.

20 Claims, 9 Drawing Sheets

PROCESS TO ACHIEVE CONTACT PROTRUSION FOR SINGLE DAMASCENE VIA

BACKGROUND

Modern day integrated chips contain millions of semiconductor devices. The semiconductor devices are electrically interconnected by way of back-end-of-the-line metal interconnect layers that are formed above the devices on an integrated chip. A typical integrated chip comprises a plurality of back-end-of-the-line metal interconnect layers embedded within dielectric material. The metal interconnect layers contain vertically alternating layers of metal wires coupled together with metal contacts (i.e., vias). The size of the metal interconnect layers increases from thin metal lines that connect to the devices, to thick metal lines that connect to off chip components.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Figure 1A:
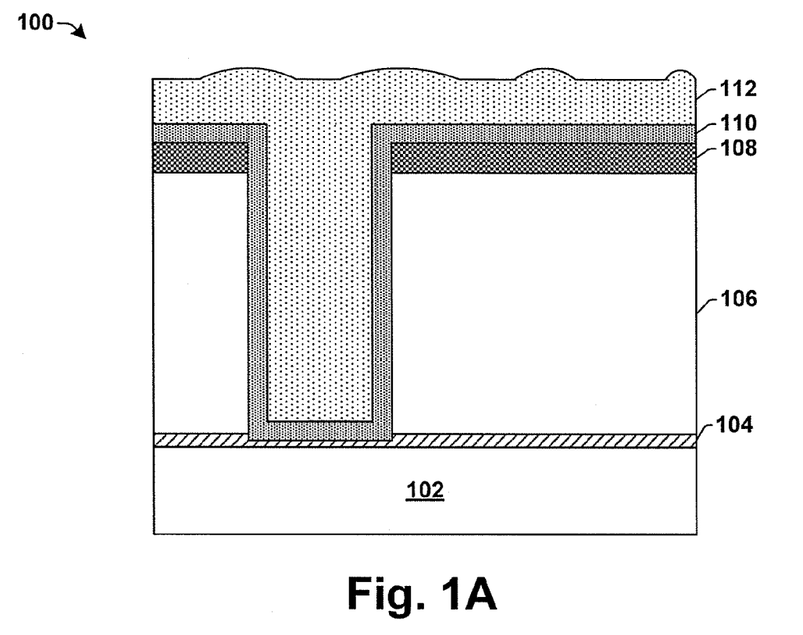
FIGS. 1A-1B illustrate cross-sectional views of a conventional back-end-of-the-line metallization process.
Figure 1B:
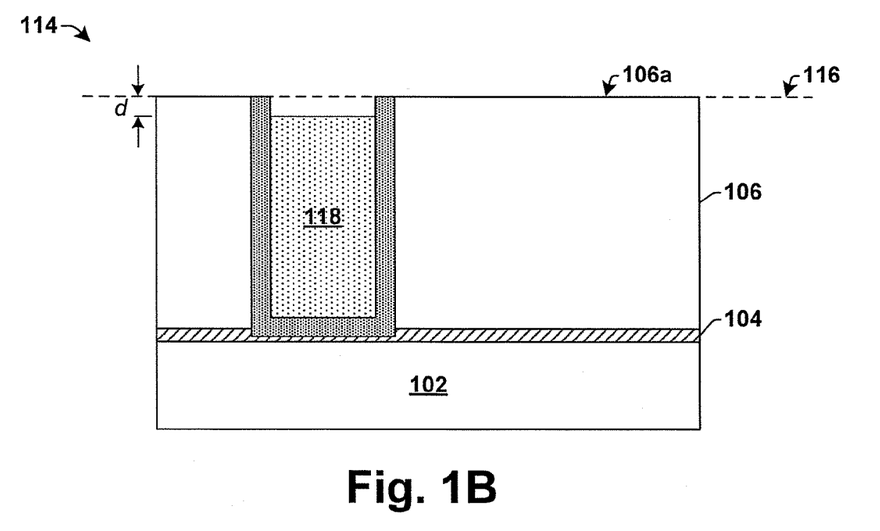

FIGS. 1A-1B are cross-sectional views, 100 and 114, of an integrated chip illustrating a conventional back-end-of-the-line metallization process. As shown in cross-sectional view 100, the metallization process comprises depositing an etch stop layer 104 on an underlying substrate 102, and then subsequently forming an inter-level dielectric (ILD) layer 106 on the etch stop layer 104. A masking layer 108 is formed on the ILD layer 106 and the ILD layer 106 is selectively etched to form a via hole. A barrier layer 110 is then deposited onto the substrate and metal 112 is deposited to fill the via hole.

After metal 112 has been deposited, a chemical mechanical polishing (CMP) process is performed to planarize the substrate, as shown in cross-sectional view 114. Planarization of the substrate removes excess material from a top surface of the substrate along line 116, resulting in a substantially flat surface upon which a subsequent metal layer is formed. However, low pattern density of metal 112 induces a faster metal etching rate that causes the metal 112 to recess or "dish", forming a metal contact 118 that is recessed below a top surface 106a of the ILD layer 106 by a depth d.

As the size of metal contacts gets smaller (e.g., ≤14 nm), the via hole gets smaller, and the recess formed by "dishing" becomes more difficult to fill. Failure to properly fill the recess results in an RC open between the metal contact 118 and an overlying metal wire. While etching (e.g., wet etching or dry plasma) can be used to remove the ILD layer 106 that is above metal contact 118 after the CMP process is performed, such etching may damage the metal contact 118 and the ILD layer 106.

Figure 2:
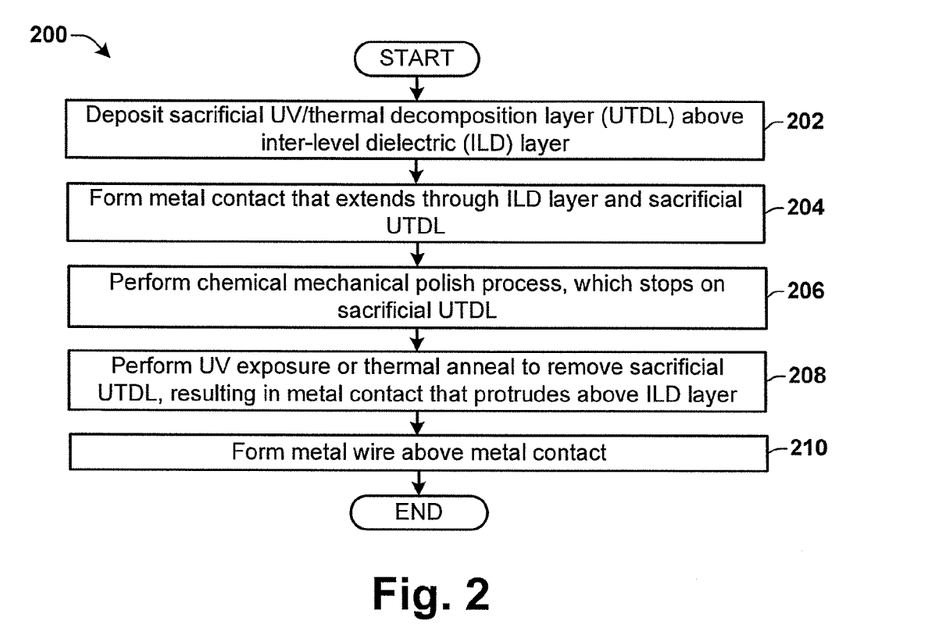
FIG. 2 is a flow diagram of some embodiments of a method for forming a back-end-of-the-line metal contact.

Accordingly, the present disclosure relates to a method of forming a back-end-of-the-line metal contact that eliminates RC opens caused by metal dishing during chemical mechanical polishing. The method is performed by depositing a sacrificial UV/thermal decomposition layer (UTDL) above an inter-level dielectric (ILD) layer. A metal contact is formed that extend through the ILD layer and the sacrificial UTDL. A chemical mechanical polishing (CMP) process is performed to generate a planar surface comprising the sacrificial UTDL. The sacrificial UTDL is then removed through an ultraviolet exposure or a thermal anneal, so that the metal contact protrudes from the ILD layer. By forming a metal contact that protrudes from the ILD layer, RC opens due to CMP "dishing" are eliminated FIG. 2 is a flow diagram of some embodiments of a method 200 for forming a back-end-of-the-line metal contact. Although method 200 is described in regards to a back-end-of-the-line integration scheme in which the metal contact is formed within a via hole located in an inter-level dielectric layer, it will be appreciated that the method may also apply to a back-end-of-the line integration scheme in which the metal contact is formed prior to deposition of a surrounding inter-level dielectric material.

At act 202, a sacrificial UV/thermal decomposition layer (UTDL) is deposited above an inter-level dielectric (ILD) layer. The sacrificial UTDL comprises a material that decomposes when exposed to thermal energy (e.g., a raised temperature) or ultra-violet radiation. In some embodiments, the sacrificial UTDL comprises a low molecular weight oligomer (e.g., a polymer having a small number of monomers).

At act 204, a metal contact is formed that extends through the ILD layer and the sacrificial UTDL. The metal contact provides for an electrical connection between an underlying conductive layer (e.g., an underlying metal layer, semiconductor device) and a top surface of the ILD layer. In some embodiments, the metal contact is formed by selectively etching the ILD layer and the sacrificial UTDL to form a via hole, which is subsequently filled with a metal.

At act 206, a chemical mechanical polishing (CMP) process, which stops on the sacrificial UTDL, is performed to form a planar surface comprising the sacrificial UTDL. The CMP process utilizes a combination of chemical and mechanical forces to remove material from a surface of a substrate.

At act 208, an ultra-violet (UV) exposure or a thermal anneal is performed. The UV exposure or thermal anneal decomposes the sacrificial UTDL so that the sacrificial UTDL is removed from the surface of the substrate, leaving the underlying ILD layer exposed. The UV exposure or thermal anneal removes the sacrificial UTDL without other processing steps (e.g., a rinsing step).

By removing the sacrificial UTDL, the top surface of the metal contact is raised relative to the surrounding ILD layer so that the metal contact forms a protrusion from the ILD layer having a positive relief. Furthermore, the use of a UV exposure or thermal anneal achieves the protrusion without affecting (i.e., damaging) the underlying ILD layer or the metal contact. By removing the sacrificial UTDL any "dishing" (i.e., negative relief) of the metal contact is eliminated and replaced by a metal contact that protrudes from a top surface of the ILD layer.

At 210, a metal wire is formed above the metal contact. Forming the metal wire above the metal contact causes the positive relief of the metal contact to be embedded within the metal wire (i.e., surrounded by the metal wire on three adjacent sides), thereby eliminating RC opens due to CMP "dishing".

Figure 3:
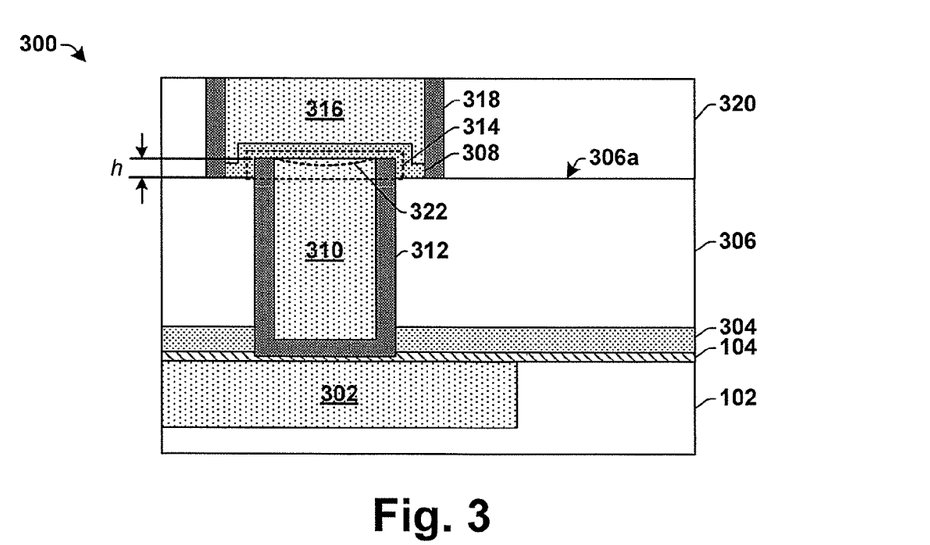
FIG. 3 is a cross-sectional view of an integrated chip having a disclosed back-end-of-the-line metal interconnect stack.

FIG. 3 is a cross-sectional view of an integrated chip 300 having a disclosed back-end-of-the-line metal interconnect stack.

The integrated chip 300 comprises an inter-level dielectric (ILD) layer 306 disposed above an underlying substrate 102. In various embodiments, the substrate 102 may comprise one or more devices and/or one or more metal interconnect layers 302 (e.g., metal wire layers and/or metal contact layers). The ILD layer 306 may comprise a low-k material or an ultra low-k dielectric material, having a dielectric constant (K) that is less than 3.9. An etch stop layer 104 is disposed between the substrate 102 and the ILD layer 306. In some embodiments, a precursor layer 304 may be disposed between the ILD layer 306 and the etch stop layer 104. In some embodiments, the precursor layer 304 may comprise a TEOS (Tetraethyl orthosilicate) layer.

A metal contact 310, which is separated from the ILD layer 306 by a barrier layer 312, extends vertically through the ILD layer 306 to form an electrical connection between one or more components in the underlying substrate 102 and a top surface 306a of the ILD layer 306. The metal contact 310 protrudes from the top surface 306a of ILD layer 306 as a positive relief 314 having a height h above the top surface 306a of the ILD layer 306. In some embodiments, the "dishing" effect of a CMP process causes a top surface of the positive relief 314 to comprise a concave surface 322.

An additional inter-level dielectric (ILD) layer 320 is disposed above ILD layer 306. A metal wire 316 is comprised within the additional ILD layer 320 at a position that is above the positive relief 314, so that the positive relief 314 of the metal contact 310 is embedded within the metal wire 316. In some embodiments, a barrier layer 308 is located at a bottom surface of the metal wire 316, such that the barrier layer 308 separates the metal wire 316 from the positive relief 314 of the metal contact 310.

Figure 4:
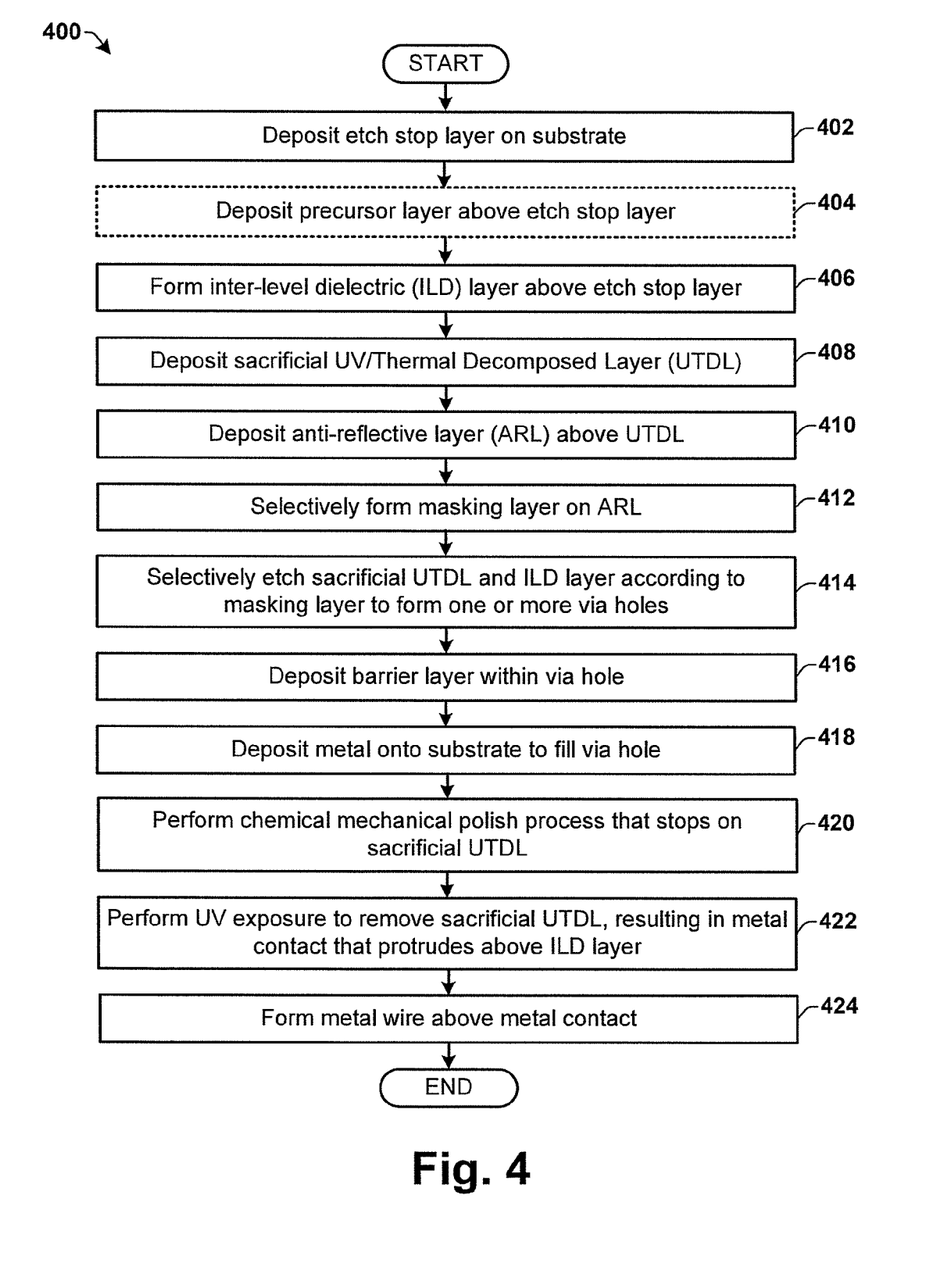
FIG. 4 is a flow diagram of some embodiments of a method for forming a back-end-of-the-line metal contact.

FIG. 4 is a flow diagram of some embodiments of a method 400 for forming a back-end-of-the-line metal contact.

While the disclosed methods (e.g., methods 200 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 402, an etch stop layer is deposited onto a substrate. The substrate may comprise any type of semiconductor body (e.g., silicon, SiGe, SOI) such as a semiconductor wafer and/or one or more die on a wafer, as well as any other type of metal layer, device, semiconductor and/or epitaxial layers, etc., associated therewith.

At act 404, a precursor layer may optionally be deposited above the etch stop layer. In some embodiments, the precursor layer aids in formation of a subsequent dielectric material on a surface of the substrate.

At act 406, an inter-level dielectric (ILD) layer is formed above the substrate. In some embodiments, the ILD layer is formed onto the precursor layer. The ILD layer is formed to a thickness that is equal to the final height of the ILD layer, since it is not subsequently subjected to a chemical mechanical polishing process (e.g., in contrast to ILD 106, which is formed to a greater height that is subsequently subjected to a CMP process).

At act 408, a sacrificial UV/thermal decomposition layer (UTDL) is deposited onto the ILD layer. In various embodiments, the sacrificial UTDL may be deposited by way of chemical vapor deposition (CVD) or spin-coating.

At act 410, an anti-reflective layer (ARL) is formed on the sacrificial UTDL. In various embodiments, the ARL may comprise TEOS (Tetraethyl orthosilicate) oxide, silicon oxynitride (SiON), or nitrogen free and Si, C rich oxide (SiOC/NFARL).

At act 412, a masking layer is selectively formed on the ARL. In some embodiments the masking layer comprises a hard mask.

At act 414, the sacrificial UTDL and the ILD layer are selectively etched according to the masking layer to form one or more via holes. The one or more via holes extend from a surface of the substrate to the etch stop layer.

At act 416, a barrier layer is deposited onto the substrate. The barrier layer is configured to prevent diffusion of metal into the ILD layer. The barrier layer is conformally deposited onto the substrate such that the barrier layer lines the via hole.

At act 418, metal is deposited on the substrate to fill the via hole.

At act 420, a chemical mechanical polishing process, which stops on the sacrificial UTDL, is performed. The CMP process achieves a planarized surface that comprises the sacrificial UTDL, upon which a subsequent metal interconnect layer may be formed.

At act 422, an ultraviolet (UV) exposure or thermal anneal is performed to remove the sacrificial UTDL. Removal of the sacrificial UTDL causes the metal contact to protrude from the ILD layer as a positive relief.

At act 424, a metal wire is formed above the protruding positive relief of the metal contact.

Some embodiments of an exemplary semiconductor substrate, whereon method 400 is implemented, are illustrated in cross-sectional views of FIGS. 5-15.

Figure 5:
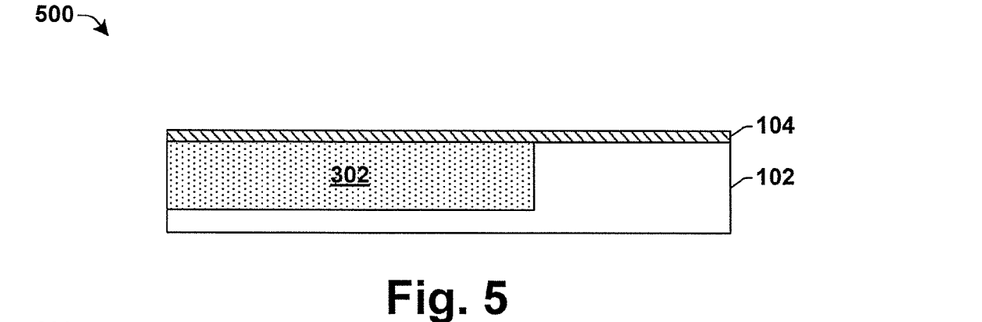
FIGS. 5-7 and FIGS. 9-15 are cross-sectional views of some embodiments of an example semiconductor substrate upon which a method of forming a back-end-of-the-line metal contact is performed.

FIG. 5 illustrates some embodiments of a cross-sectional view 500 corresponding to act 402. Cross-sectional view 500 illustrates an example of a substrate 102. In various embodiments, the substrate 102 may comprise one or more devices and/or one or more underlying metal interconnect layers 302 (e.g., metal wire layers and/or metal contact layers).

An etch stop layer 104 is formed above the substrate 102. In some embodiments, the etch stop layer 104 may comprise a silicon carbide (SiC) layer deposited onto the substrate 102 by way of chemical vapor deposition (CVD).

Figure 6:
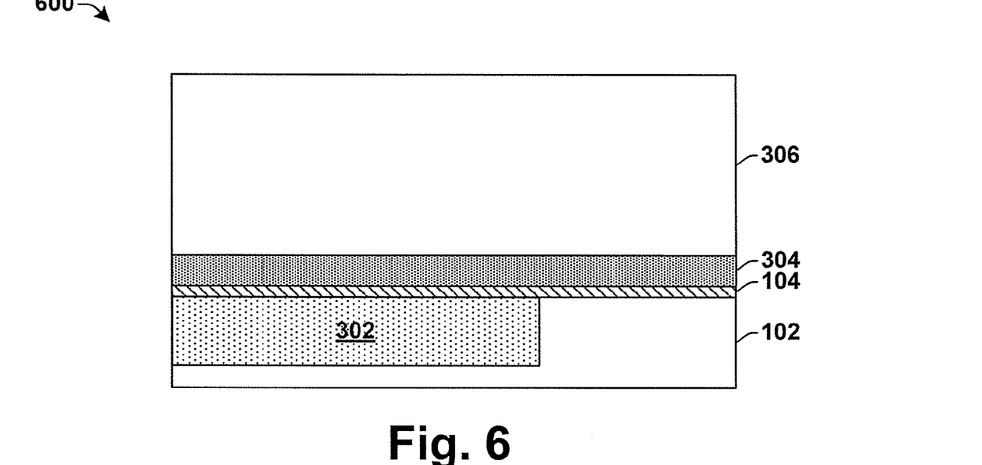

FIG. 6 illustrates some embodiments of a cross-sectional view 600 corresponding to acts 404-406. As shown in cross-sectional view 600, an inter-level dielectric (ILD) layer 306 is formed above the etch stop layer 104. In various embodiments, the ILD layer 306 may comprise a low-k dielectric material or an ultra low-k (ULK) dielectric material, which have dielectric constants that are small relative to silicon dioxide. For example, the ILD layer 306 may comprise a low-k SiOCH. In some embodiments, the ILD layer 306 may be formed on the substrate 102 using a deposition process or may be grown on the substrate 102 using a thermal oxidation process.

In some embodiments, a precursor layer 304 may be deposited onto the etch stop layer 104 prior to formation of the ILD layer 306. In some embodiments, the precursor layer 304 may comprise a TEOS (Tetraethyl orthosilicate) layer. The precursor layer 304 may be partially or completely consumed during formation of the ILD layer 306.

Figure 7:
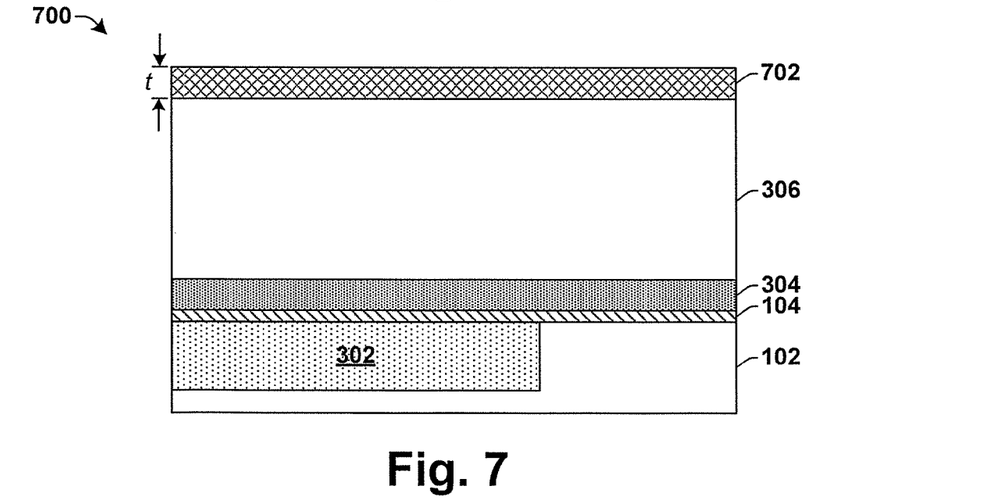

FIG. 7 illustrates some embodiments of a cross-sectional view 700 corresponding to act 408. As shown in cross-sectional view 700, a sacrificial UTDL 702 is deposited above the ILD layer 306. In some embodiments, the sacrificial UTDL 702 is deposited onto the ILD layer 306 by way of a chemical vapor deposition (CVD). In other embodiments, the sacrificial UTDL 702 may be deposited onto the ILD layer 306 by way of spin coating. In some embodiments, the sacrificial UTDL 702 is deposited to a thickness t having a range of approximately 100 angstrom to approximately 300 angstrom.

The sacrificial UTDL 702 comprises a macromolecular porogen precurtor having a formula of $C_xH_yO_z$, wherein x, y, and z are integers having a value of 0 or greater. In some embodiments, the macromolecular porogen precursor comprises at least one double bond.

FIGS. 8A-8G illustrate some examples of sacrificial UTDL compounds. It will be appreciated that the compounds shown in FIGS. 8A-8G are non-limiting examples of sacrificial UTDL materials.

Figure 8A:
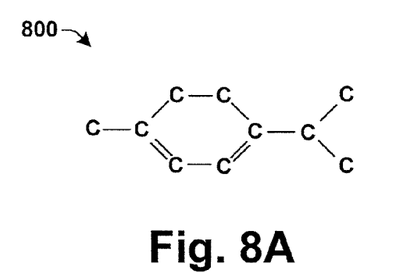
FIGS. 8A-8G illustrate some examples of sacrificial UTDL compounds.

FIG. 8A illustrates a sacrificial UTDL 800 comprising a porogen of alpha terpinene (ATRP), which has a chemical composition of $C_{10}H_{16}$.

Figure 8B:
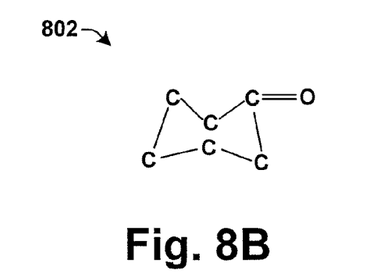

FIG. 8B illustrates a sacrificial UTDL 802 comprising a porogen of Trimethylcyclohexane (TMC), which has a chemical composition of $C_9H_{18}$.

Figure 8C:
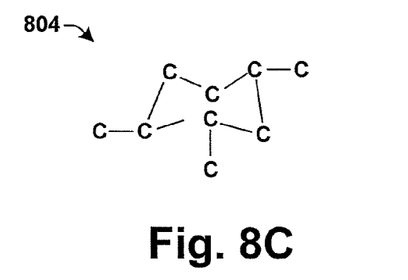

FIG. 8C illustrates a sacrificial UTDL 804 comprising a porogen of Cyclohexanone (CHO), which has a chemical composition of $C_6H_{10}O$.

Figure 8D:
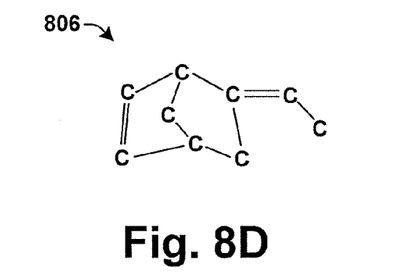

FIG. 8D illustrates a sacrificial UTDL 806 comprising a porogen of Ethylidene Norborene (ENB), which has a composition of $C_9H_{12}$.

Figure 8E:
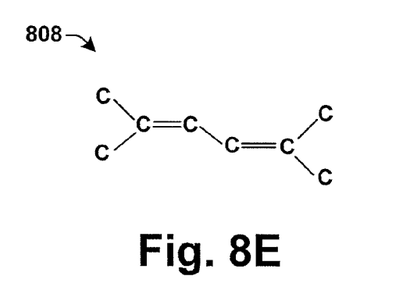

FIG. 8E illustrates a sacrificial UTDL 808 comprising a porogen of dimethylhexanediamine (DMHD), which has a chemical composition of $C_8H_{14}$.

Figure 8F:
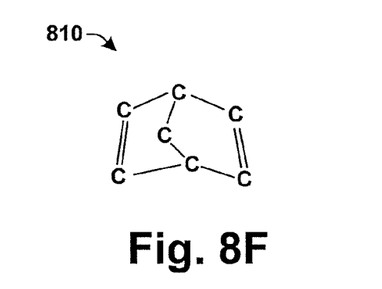

FIG. 8F illustrates a sacrificial UTDL 810 comprising a porogen of bicycloheptadiene (BCHD), which has a chemical composition of $C_7H_8$.

Figure 8G:
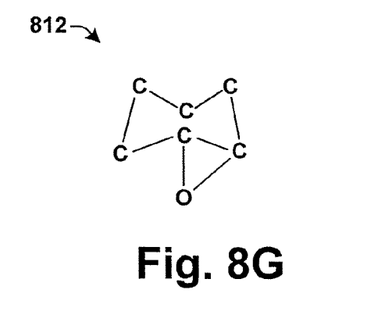

FIG. 8G illustrates a sacrificial UTDL 812 comprising a porogen of cyclohexene oxide (CHOX), which has a chemical composition of $C_6H_{10}O$.

Figure 9:
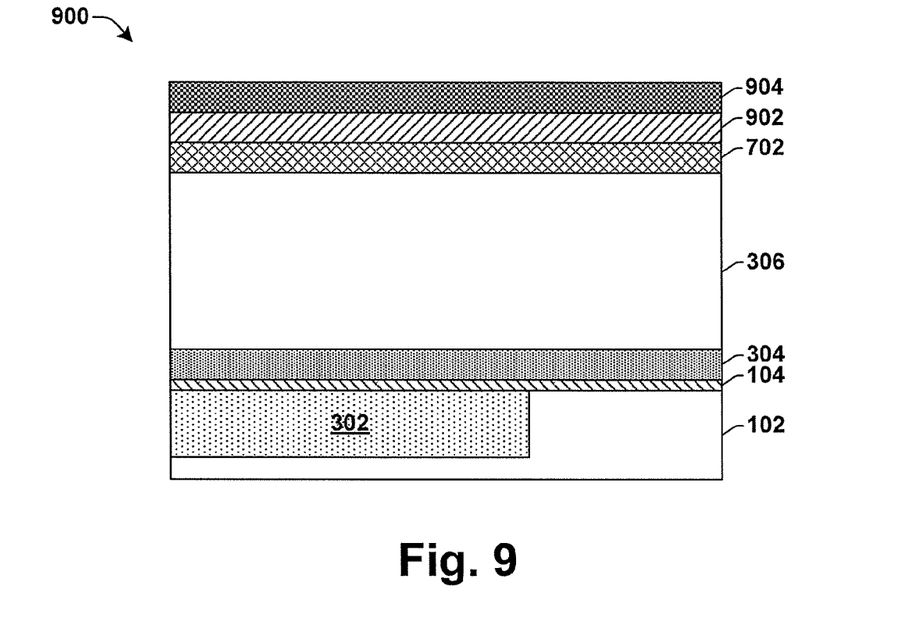

FIG. 9 illustrates some embodiments of a cross-sectional view 900 corresponding to acts 410-412. As shown in cross-sectional view 900, an anti-reflective layer (ARL) 902 is deposited onto the sacrificial UTDL 702. A masking layer comprising a hard mask 904 is formed above the ARL 902. In some embodiments, the ARL 902 may comprise a nitrogen free ARL (NFARL) deposited by chemical vapor deposition. The nitrogen free ARL comprises an oxide without nitrogen atoms and may contain some carbon atoms (e.g., SiOC). In some embodiments, the hard mask 904 may comprise a titanium nitride (TiN) layer with a deposition process. In other embodiments, the hard mask 904 may comprise other suitable materials such as titanium aluminum nitride (TiAlN), for example.

Figure 10:
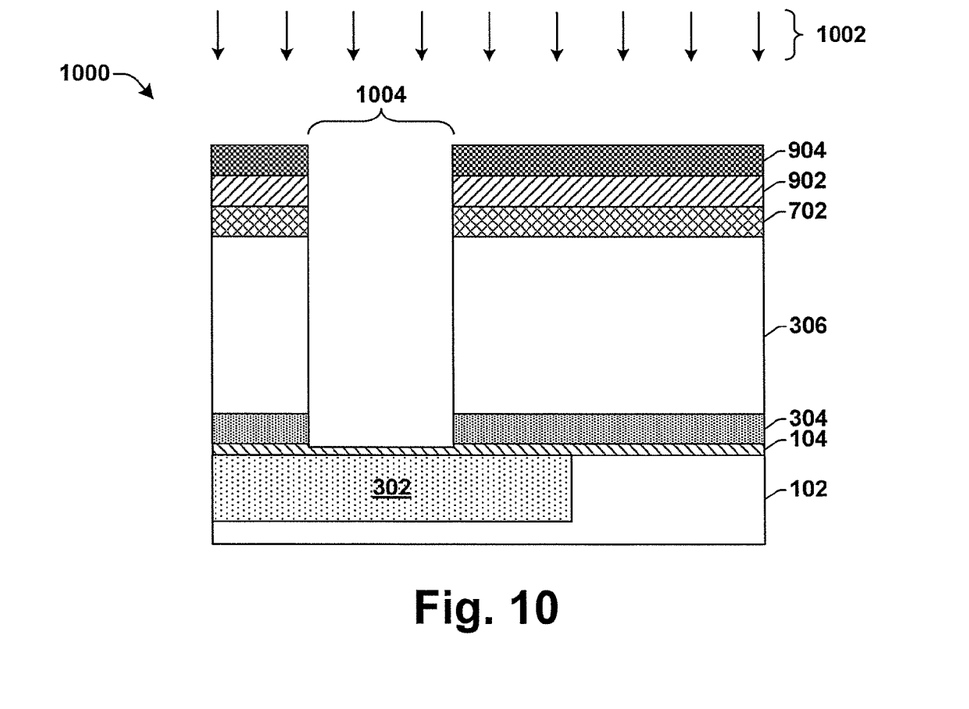

FIG. 10 illustrates some embodiments of a cross-sectional view 1000 corresponding to act 414. As shown in cross-sectional view 1000, one or more openings that define the location of one or more metal contact layers in the underlying ILD layer 306 are formed in the hard mask 904. An etching process is then performed, in which the substrate is selectively exposed to an etchant 1002 configured to etch one or more underlying layers (e.g., the ARL 902, sacrificial UTDL 702, ILD layer 306, and the precursor layer 304) according to the hard mask 904. The etchant 1002 forms one or more via holes 1004 that extend from a top surface of ILD layer 306 to the etch stop layer 104. In some embodiments, the etching process comprises a dry etching process that uses an etchant 1002 having a $F_2$/Ar chemistry.

Figure 11:
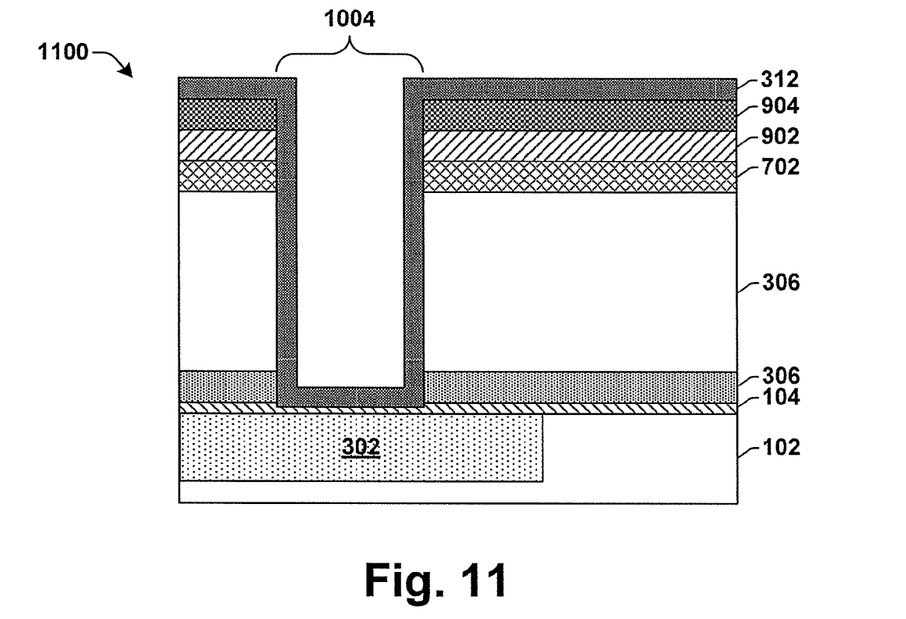

FIG. 11 illustrates some embodiments of a cross-sectional view 1100 corresponding to act 416. As shown in cross-sectional view 1100, a barrier layer 312 is deposited onto the substrate. The barrier layer 312 is deposited to conform to the hard mask 904 and to the sidewalls and bottom of the one or more via holes 1004. In some embodiments, the barrier layer 312 comprises a titanium nitride (TiN) layer deposited by way of deposition process (e.g., a physical vapor deposition such as sputtering) performed in a processing chamber held under vacuum. In other embodiments, the barrier layer 312 may comprise other suitable metals such as tantalum nitride (TaN), tungsten nitride (WN), hafnium nitride (HfN), etc.

Figure 12:
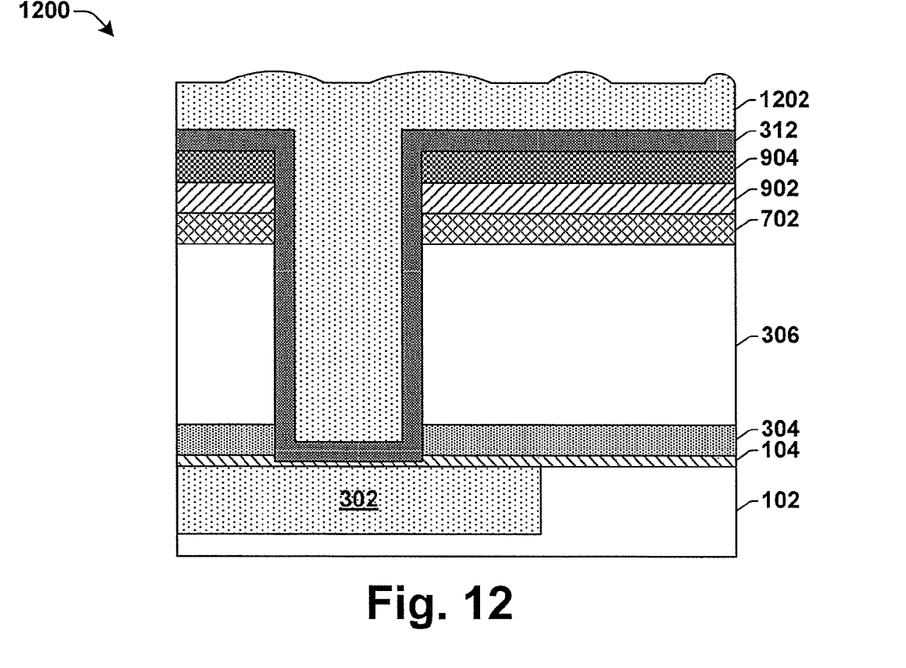

FIG. 12 illustrates some embodiments of a cross-sectional view 1200 corresponding to act 418. As shown in cross-sectional view 1200, metal 1202 is deposited onto the substrate to fill the one or more via holes 1004. In some embodiments, the metal 1202 may comprise a copper metal deposited by way of physical vapor deposition (e.g., sputtering), for example. In some embodiments, a seed layer may be deposited onto the substrate by way of physical vapor deposition, while the metal 1202 is subsequently formed from the seed layer by way of a plating process (e.g., an electroplating or electroless plating process).

Figure 13:
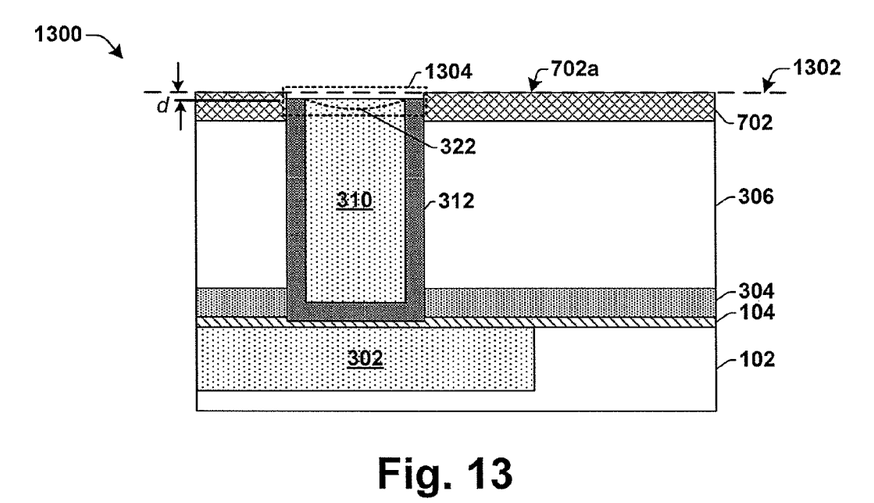

FIG. 13 illustrates some embodiments of a cross-sectional view 1300 corresponding to act 420. As shown in cross-sectional view 1300, the surface of the substrate is planarized using a chemical mechanical polishing (CMP) process. The CMP process removes material from the substrate to form a metal contact 310 and to expose the sacrificial UTDL 702 along a substantially flat surface corresponding to line 1302. The CMP process may cause "dishing" in the metal contact 310 that forms a negative relief 1304 so that the metal contact 310 is depressed below a top surface 702a of the sacrificial UTDL 702 to a depth d. In some embodiments, the "dishing" causes a top surface of the metal contact 310 to comprise a concave surface 322.

Figure 14:
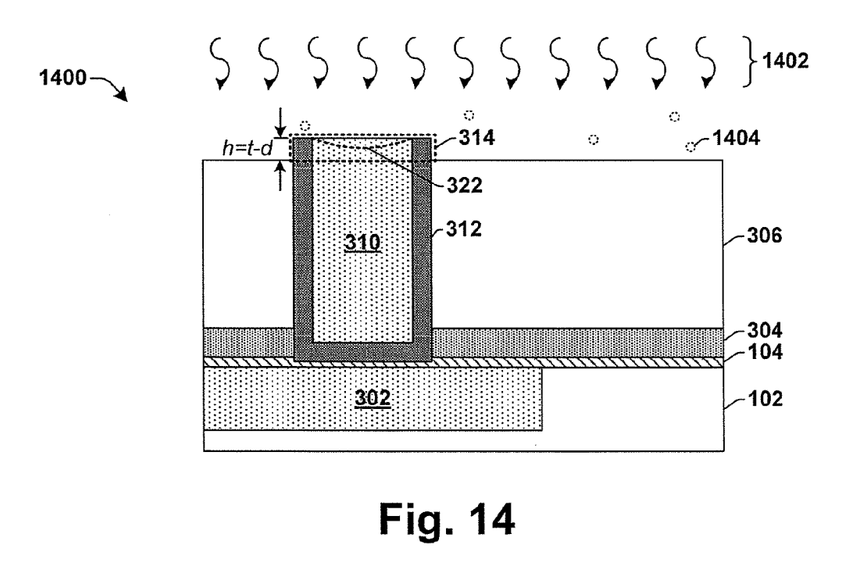

FIG. 14 illustrates some embodiments of a cross-sectional view 1400 corresponding to act 422. As shown in cross-sectional view 1400, the sacrificial UTDL 702 is removed by exposing the sacrificial UTDL 702 to a decomposing agent 1402 comprising a UV exposure or a thermal anneal. The decomposing agent removes the sacrificial UTDL 702 from the substrate without additional processing, causing the metal contact 310 and the barrier layer 312 to protrude as a positive relief 314 from an exposed ILD layer 306 by a height, h=t−d. In some examples, the sacrificial UTDL 702 may be exposed to the decomposing agent 1402 (e.g., UV exposure or a thermal anneal) for a time having a range of approximately 1 minute to approximately 15 minutes. In other examples, the sacrificial UTDL 702 may be exposed to the decomposing agent 1402 (e.g., UV exposure or a thermal anneal) for other time periods.

In some embodiments, the UV exposure may expose selective sections of the substrate to UV radiation, while in other embodiments the UV exposure comprises a blanket exposure that exposes the entire substrate to UV radiation. The UV radiation decomposes the sacrificial UTDL 702 to remove the sacrificial UTDL 702 from above ILD layer 306. The UV radiation decomposes the sacrificial UTDL 702 without damaging the metal contact 310 or the underlying ILD layer 306. In some embodiments, the UV exposure is performed in a processing chamber having an environment comprising an ambient gas 1404 comprising a Helium (He) gas, an Ammonia ($NH_3$) gas, a Nitrogen ($N_2$) gas, an Argon (Ar) gas, or a Hydrogen ($H_2$) gas.

In some embodiments, the thermal anneal raises the temperature of the sacrificial UTDL to a temperature in the range of approximately 300° C. to approximately 400° C. In some embodiments, the thermal anneal process may comprise a pre-heating process, which is performed after the CMP process and prior to deposition of an etch stop layer (e.g., for metal wire 316), as part of an etch stop chemical vapor deposition (CVD) process. In such an embodiment, the sacrificial UTDL is removed without introducing new process steps into the back-end-of-the line processing scheme.

Figure 15:
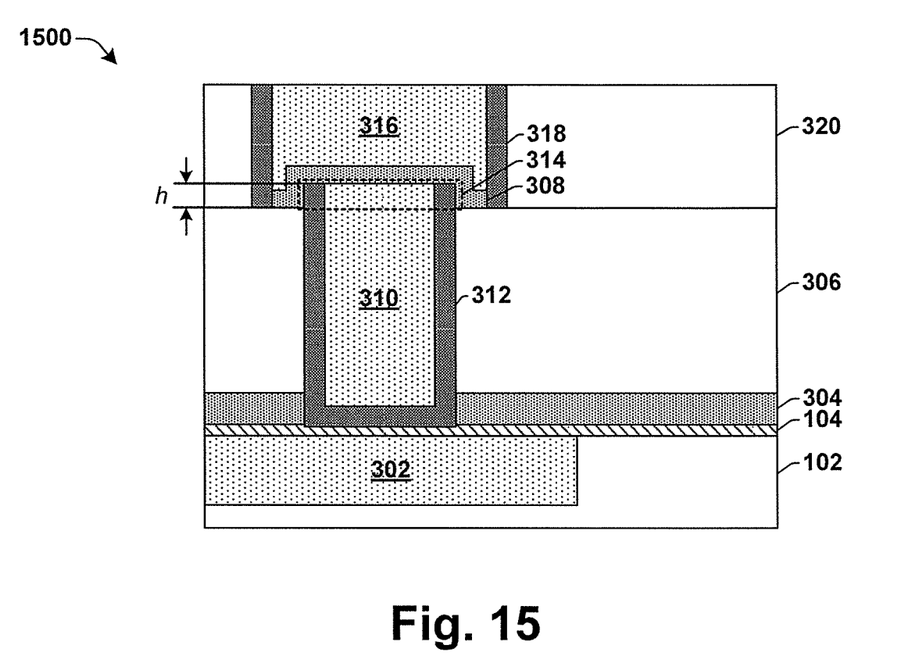

FIG. 15 illustrates some embodiments of cross-sectional views 1500 corresponding to act 424. As shown in cross-sectional view 1500, a metal wire 316 is formed on the protruding structure of the positive relief 314. The metal wire 316 is formed within an additional ILD layer 320, located above ILD layer 306, at a position that is above the positive relief 314, such that the positive relief 314 of the metal contact 310 is embedded within the metal wire 316. In some embodiments, a barrier layer 308 is deposited above the metal contact 310 at a bottom surface of the metal wire 316, such that the barrier layer 308 separates the metal wire 316 from the positive relief 314 of the metal contact 310.

It will be appreciated that while reference is made throughout this document to exemplary structures in discussing aspects of methodologies described herein, those methodologies are not to be limited by the corresponding structures presented. For example, the methodologies set forth in FIG. 4 are not limited to the structure presented in FIGS. 5-15. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of forming a back-end-of-the-line metal contact that eliminates RC opens caused by metal dishing during chemical mechanical polishing.

In some embodiments, the present disclosure relates a method of forming a back-end-of-the-line metal contact, comprising depositing a sacrificial UV/thermal decomposition layer (UTDL) above an inter-level dielectric (ILD) layer. The method further comprises forming a metal contact that extends through the ILD layer and the sacrificial UTDL. The method further comprises performing a chemical mechanical polishing (CMP) process to generate a planar surface comprising the sacrificial UTDL. The method further comprises removing the sacrificial UTDL by way of an ultraviolet exposure or a thermal anneal, so that the metal contact protrudes from the ILD layer.

In other embodiments, the present disclosure relates to a method of forming a back-end-of-the-line metal contact. The method comprises depositing an etch stop layer on a substrate. The method further comprises forming an inter-level dielectric (ILD) layer above the etch stop layer and depositing a sacrificial UV/thermal decomposition layer (UTDL) on the ILD layer. The method further comprises selectively etching the sacrificial UTDL and the ILD layer to form a via hole that extends through the sacrificial UTDL and the ILD layer and depositing metal within the via hole to form a metal contact. The method further comprises performing a chemical mechanical polishing (CMP) process after forming the metal contact, wherein the CMP process generates a planar surface comprising the sacrificial UTDL. The method further comprises performing an ultraviolet exposure or a thermal anneal that decomposes the sacrificial UTDL, so that the metal contact protrudes from the ILD layer as a positive relief.

In other embodiments, the present disclosure relates to an integrated chip having a back-end-of-the-line metal contact. The integrated chip comprises a metal contact vertically extending through an inter-level dielectric (ILD) layer and protruding from the ILD layer as a positive relief. A barrier layer is disposed on the positive relief of the metal contact. A metal wire is disposed within an additional ILD layer at a position that is separated from the positive relief by the barrier layer, wherein the positive relief of the metal contact is embedded within the metal wire.

What is claimed is:

1. A method of forming a back-end-of-the-line metal contact, comprising:
    depositing a sacrificial UV/thermal decomposition layer (UTDL) above an inter-level dielectric (ILD) layer;
    forming a metal contact that extends through the ILD layer and the sacrificial UTDL;
    performing a chemical mechanical polishing (CMP) process to generate a planar surface comprising the sacrificial UTDL; and
    removing the sacrificial UTDL by way of an ultraviolet exposure or a thermal anneal, so that the metal contact protrudes from the ILD layer.

2. The method of claim 1, wherein forming the metal contact comprises:
    depositing an anti-reflective layer on the sacrificial UTDL;
    depositing a masking layer on the anti-reflective layer;
    selectively etching the sacrificial UTDL and the ILD layer according to the masking layer to form one or more via holes; and depositing a metal to fill the one or more via holes;
wherein the CMP process removes the anti-reflective layer and the masking layer and stops on the sacrificial UTDL.

3. The method of claim 1, wherein removing the sacrificial UTDL comprises thermally annealing the sacrificial UTDL at a temperature in a range of approximately 300° C. to approximately 400° C.

4. The method of claim 1, wherein removing the sacrificial UTDL comprises exposing the sacrificial UTDL to UV radiation in a Helium (He) gas, Ammonia ($NH_3$) gas, a Nitrogen ($N_2$) gas, an Argon (Ar) gas, or a Hydrogen ($H_2$) gas.

5. The method of claim 1, wherein the sacrificial UTDL comprises a compound having a formula of CxHyOz with at least one double bond.

6. The method of claim 1, wherein the sacrificial UTDL comprises $C_{10}H_{16}$, $C_9H_{18}$, $C_8H_{14}$, $C_6H_{10}O$, $C_9H_{12}$, or $C_7H_8$.

7. The method of claim 1, wherein the ILD layer comprises a low-k dielectric material or an ultra low-k dielectric material.

8. The method of claim 1, wherein the sacrificial UTDL is deposited by chemical vapor deposition or by spin coating to a thickness having a range of approximately 100 angstrom to approximately 300 angstrom.

9. The method of claim 1, wherein the metal contact is formed prior to performing a deposition of the ILD layer.

10. A method of forming a back-end-of-the-line metal contact, comprising:
depositing an etch stop layer on a substrate;
forming an inter-level dielectric (ILD) layer above the etch stop layer;
depositing a sacrificial UV/thermal decomposition layer (UTDL) on the ILD layer;
selectively etching the sacrificial UTDL and the ILD layer to form a via hole that extends through the sacrificial UTDL and the ILD layer;
depositing metal within the via hole to form a metal contact;
performing a chemical mechanical polishing (CMP) process after forming the metal contact, wherein the CMP process generates a planar surface comprising the sacrificial UTDL; and
performing an ultraviolet exposure or a thermal anneal that decomposes the sacrificial UTDL, so that the metal contact protrudes from the ILD layer as a positive relief.

11. The method of claim 10, further comprising:
depositing an anti-reflective layer on the sacrificial UTDL;
depositing a hard mask on the anti-reflective layer; and
selectively etching the sacrificial UTDL and the ILD layer according to the hard mask to form the via hole;
wherein the CMP process removes the anti-reflective layer and the hard mask and stops on the sacrificial UTDL.

12. The method of claim 10, the thermal anneal comprises a temperature in a range of approximately 300° C. to approximately 400° C.

13. The method of claim 10, wherein the ultraviolet exposure is performed in a processing chamber comprising a Helium (He) gas, Ammonia ($NH_3$) gas, a Nitrogen ($N_2$) gas, an Argon (Ar) gas, or a Hydrogen ($H_2$) gas.

14. The method of claim 10, wherein the sacrificial UTDL comprises a compound having a formula of CxHyOz with at least one double bond.

15. The method of claim 10, wherein the sacrificial UTDL comprises $C_{10}H_{16}$, $C_9H_{18}$, $C_8H_{14}$, $C_6H_{10}O$, $C_9H_{12}$, or $C_7H_8$.

16. The method of claim 10, wherein the sacrificial UTDL is deposited by chemical vapor deposition.

17. The method of claim 16, wherein the sacrificial UTDL is deposited to a thickness having a range of approximately 100 angstrom to approximately 300 angstrom.

18. A method of forming an integrated chip back-end-of-the-line, comprising:
depositing a sacrificial UV/thermal decomposition layer (UTDL) above an inter-level dielectric (ILD) layer;
forming a metal contact that extends through the ILD layer and the sacrificial UTDL;
generating a planar surface over the ILD layer, wherein the planar surface comprises the metal contact and the sacrificial UTDL;
removing the sacrificial UTDL, so that the metal contact protrudes from the ILD layer as a positive relief; and
forming a metal wire within an additional ILD layer overlying the ILD layer, wherein the positive relief of the metal contact is embedded within the metal wire.

19. The method of claim 18, wherein a top surface of the positive relief comprises a concave surface.

20. The method of claim 18, wherein the metal wire is separated from the positive relief by a barrier layer.

* * * * *